US012328871B2

United States Patent
Huang et al.

(10) Patent No.: US 12,328,871 B2
(45) Date of Patent: Jun. 10, 2025

(54) HIGH WRITING RATE ANTIFUSE ARRAY

(71) Applicant: YIELD MICROELECTRONICS CORP., Chu-Pei (TW)

(72) Inventors: Yu Ting Huang, Chu-Pei (TW); Chi Pei Wu, Chu-Pei (TW)

(73) Assignee: Yield Microelectronics Corp., Chu-Pei (TW)

( * ) Notice: Subject to any disclaimer, the term of this patent is extended or adjusted under 35 U.S.C. 154(b) by 642 days.

(21) Appl. No.: 17/455,546

(22) Filed: Nov. 18, 2021

(65) Prior Publication Data
US 2023/0113604 A1    Apr. 13, 2023

(30) Foreign Application Priority Data
Oct. 8, 2021    (TW) .................................. 110137425

(51) Int. Cl.
*H10B 20/25* (2023.01)
*H01L 23/525* (2006.01)
*H10B 20/00* (2023.01)
*H10B 20/20* (2023.01)

(52) U.S. Cl.
CPC ......... *H10B 20/25* (2023.02); *H01L 23/5252* (2013.01); *H10B 20/20* (2023.02); *H10B 20/367* (2023.02)

(58) Field of Classification Search
CPC .... H10B 20/25; H10B 20/367; H01L 23/5252
See application file for complete search history.

(56) References Cited

U.S. PATENT DOCUMENTS

| | | | | |
|---|---|---|---|---|
| 2004/0047218 A1* | 3/2004 | Peng | ...................... | G11C 17/16 257/E21.666 |
| 2009/0026577 A1* | 1/2009 | Ogawa | ................ | H01L 23/5252 257/530 |
| 2014/0231895 A1* | 8/2014 | Rothleitner | ............ | G11C 17/16 257/315 |

FOREIGN PATENT DOCUMENTS

TW              718861 B        2/2021

* cited by examiner

*Primary Examiner* — Aaron J Gray
(74) *Attorney, Agent, or Firm* — Rosenberg, Klein & Lee

(57) ABSTRACT

A high writing rate antifuse array includes at least one sub-memory array including two antifuse memory cells arranged side by side between two neighboring bit lines. Each of two antifuse memory cells includes an antifuse transistor. The antifuse transistor has at least one sharp corner overlapping an antifuse gate above a first gate dielectric layer. Each of two antifuse memory cells includes a selection transistor. The second gate dielectric layers of two selection transistors are connected with each other. Thus, two antifuse memory cells are connected with the same select line and the same word line but are respectively connected with different bit lines. In the present invention, a common source contact is used, and two selection transistors share a channel, whereby to stabilize the source structure, increase the channel width of the selection transistors, and raise the writing rate without increase of overall area of the layout.

9 Claims, 6 Drawing Sheets

HIGH WRITING RATE ANTIFUSE ARRAY

This application claims priority of Application No. 110137425 filed in Taiwan on 8 Oct. 2021 under 35 U.S.C. § 119; the entire contents of all of which are hereby incorporated by reference.

BACKGROUND OF THE INVENTION

Field of the Invention

The present invention relates to an antifuse transistor, particularly to a high writing rate antifuse array.

Description of the Prior Art

In an antifuse transistor, a dielectric layer is interposed between two conductors to form a capacitor. In writing, two biases are respectively applied to two conductors to break through the dielectric layer. After writing, the resistance of the antifuse decreases. With fast development of IC, the size of elements becomes smaller and smaller. Recently, an MOS-based antifuse transistor has been developed. The writing operation of the MOS-based antifuse transistor depends on the breakdown mechanism of the dielectric layer of the gate electrode. Because the permanent electric-conduction path of the antifuse transistor relies on the breakdown of the gate dielectric layer, a voltage sufficient to induce breakdown of the gate dielectric layer is required. In the conventional antifuse transistor, the interface above the gate dielectric layer is normally a planar surface, and charges are uniformly distributed thereon. Thus, a high voltage and a high current are required to break through the gate dielectric layer. However, such a situation increases the area of the element.

The Applicant has proposed a low-voltage antifuse element and array, i.e. the Taiwan patent application of No. 109103372. Refer to FIG. 1. In antifuse memory cells 1, each antifuse gate 2 is shared by four gate dielectric layers 3, making a sharp corner generated in the border between the antifuse gate 2 and the gate dielectric layer 3. Such a sharp corner may lower the breakdown voltage, decrease the current consumption, and reduce the element area. While a writing operation is performed, the select line SL1 or SL2 is grounded to select the upper row of antifuse memory cells 1 or the lower row of antifuse memory cells 1 in the array. Next, a low voltage is applied to the word line WL1 or WL2 to select a specified memory cell 1 among a low of memory cells 1. Then, the gate dielectric layer 3 of the specified memory cell 1 is broken through. When a specified antifuse memory cell 1 is selected for writing, the other unselected antifuse memory cells 1 are likely to be affected by the selection bias. Hence, leakage current may flow to the unselected antifuse memory cells 1 through the bit line BL1. Besides, the stability of the source structure is insufficient, and the cost is thus increased. Further, the writing efficiency thereof still needs improving.

SUMMARY OF THE INVENTION

The primary objective of the present invention is to provide a high writing rate antifuse array to solve the abovementioned problem, wherein two selection transistors share a common channel, whereby to increase the width of the channel of the selection transistor and increase the writing rate. Further, the contacts of the source electrodes are shared to decrease the area of the memory cells and reduce the cost. Furthermore, the present invention can decrease the types of control voltages and prevent leakage current.

In order to achieve the abovementioned objective, the present invention provides a high writing rate antifuse array, which comprises a plurality of parallel bit lines, a plurality of parallel word lines, a plurality of parallel select lines, and at least one sub-memory array, wherein the bit lines are extended along a first direction and include a first bit line and a second bit line, which neighbor each other; the word lines are extended along a second direction that is different from the first direction and vertical to the bit lines and include a first word line; the select line is extended along the second direction and parallel to the word lines and includes a first select line; the sub-memory array includes a first antifuse memory cell and a second antifuse memory cell. The first antifuse memory cell includes a first antifuse transistor and a first selection transistor. The first antifuse transistor is connected with the first bit line. The first selection transistor is cascaded to the first antifuse transistor and connected with the first word line and the first select line. The second antifuse memory cell includes a second antifuse transistor and a second selection transistor. The second antifuse transistor is connected with the second bit line. The second selection transistor is cascaded to the second antifuse transistor and connected with the first word line and the first select line. The first antifuse memory cell and the second antifuse memory cell are adjacent to each other along the second direction and disposed between the first bit line and the second bit line.

Each of the first antifuse transistor and the second antifuse transistor includes a first gate dielectric layer and an antifuse gate. The antifuse gate has at least one sharp corner overlapping the first gate dielectric layer. In one embodiment, the overlapping region of the antifuse gate and each gate dielectric layer has at least one sharp corner. In operation, the sharp point has a higher charge density, whereby the breakdown voltage is decreased, and the current for programming the antifuse memory cells is lowered, and the area of the element is reduced. Each of the first selection transistor and the second selection transistor includes a second gate dielectric layer. The second dielectric layers are connected with each other. In one embodiment, the antifuse transistor has a first channel region in the underneath thereof; the first selection transistor and the second selection transistor share a second channel region. The second channel region is wider than the first channel region. Thereby, the channel width of the selection transistors is enlarged and the writing rate is raised, while the overall area of the layout is not increased.

Below, embodiments are described in cooperation with the attached drawings for elucidating the objectives, technical contents, characteristics, and accomplishments of the present invention.

DETAILED DESCRIPTION OF THE INVENTION

Figure 1:
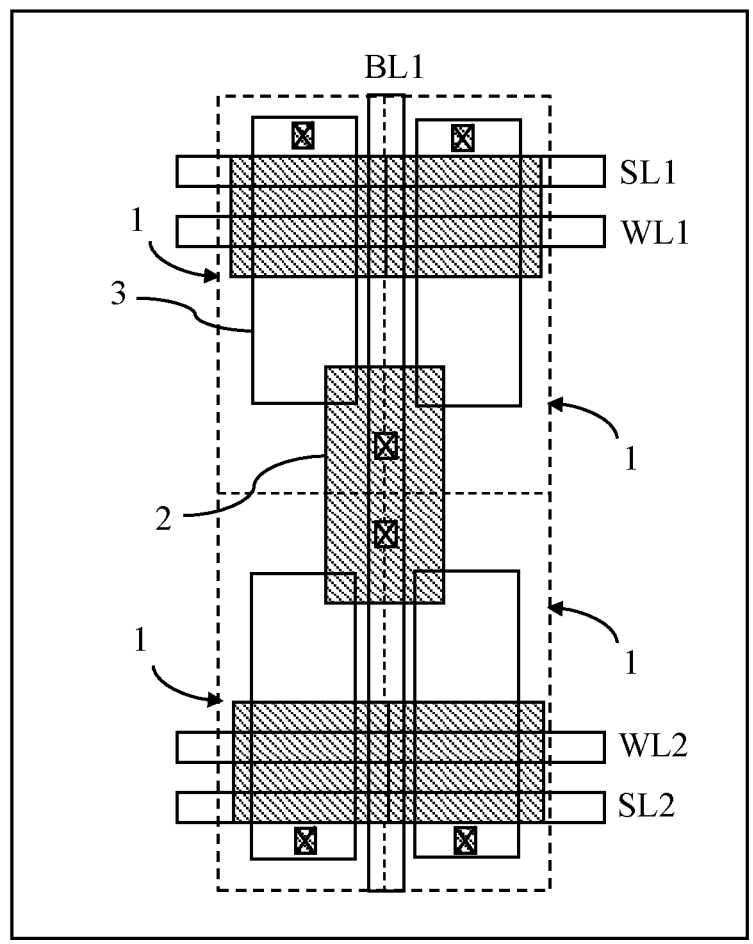
FIG. 1 is a diagram schematically showing a planar layout of a conventional antifuse array.
Figure 2:
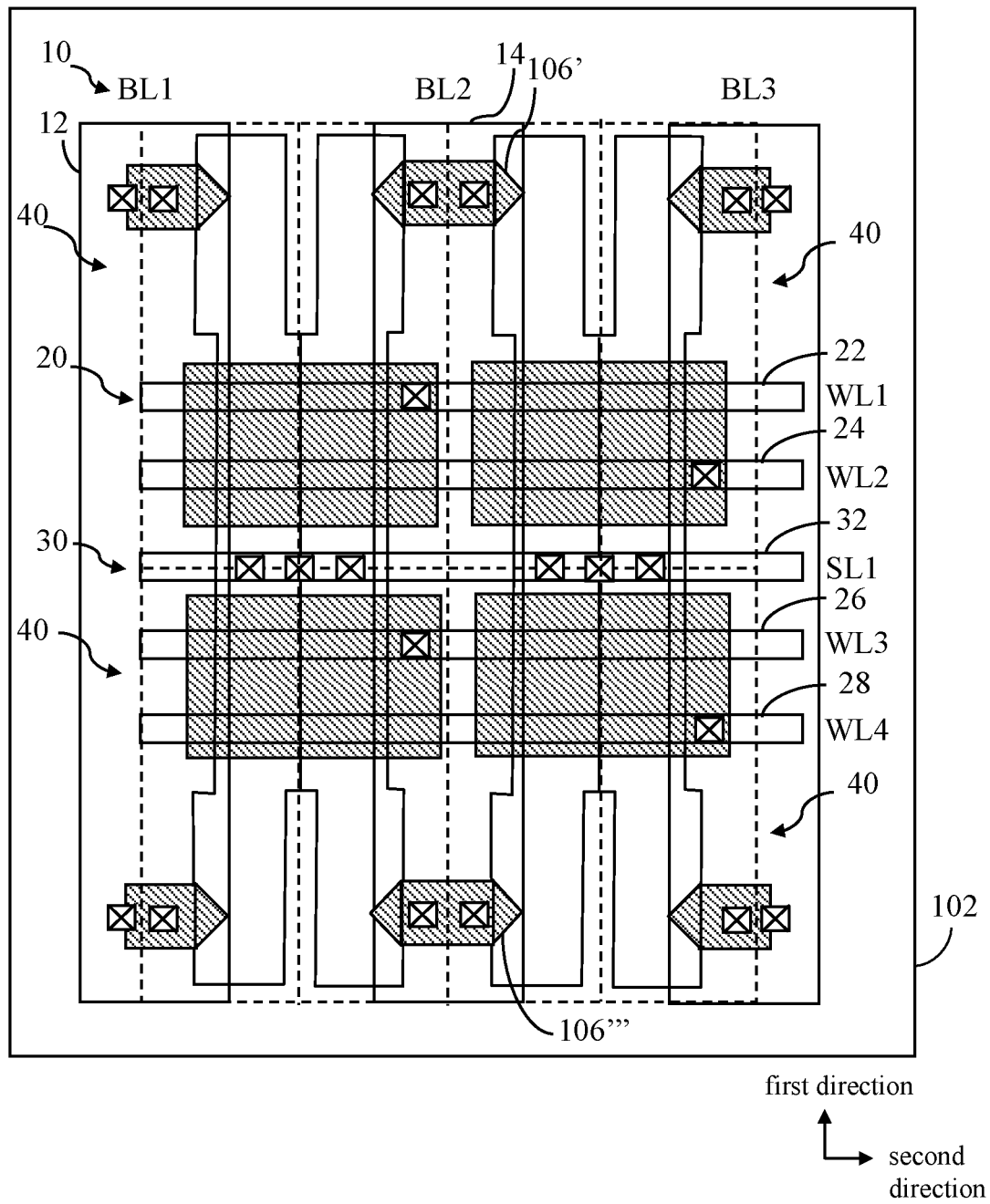
FIG. 2 is a diagram schematically showing a planar layout of a high writing rate antifuse array according to a first embodiment of the present invention.

Refer to FIG. 2, which is a diagram schematically showing a planar layout of a high writing rate antifuse array according to a first embodiment of the present invention. In the first embodiment, the high writing rate antifuse array comprises a plurality of parallel bit lines 10, a plurality of parallel word lines 20, a plurality of parallel select lines 30, and at least one sub-memory array 40. The bit lines 30 are extended along a first direction and include bit lines BL1-BL3, wherein the bit line BL1 is defined as a first bit line 12, and the bit line BL2 is defined as a second bit line 14. The plurality of word lines 20 is vertical to the bit lines 20 and extended along a second direction that is different from the first direction. The word lines 20 include word lines WL1-WL4, wherein the word lines WL1-WL4 are respectively defined as a first word line 22, a second word line 24, a third word line 26 and a fourth word line 28. The plurality of select lines 30 are parallel to the word lines 20 and extended along the second direction. The select lines 30 include a select line SL1, wherein the select line SL1 is defined as a first select line 32. In the first embodiment, the vertical direction is the first direction, and the horizontal direction is the second direction. The bit lines 10, the word lines 20 and the select lines 30 are connected with at least one sub-memory array 40. The four sub-memory arrays 40 shown in FIG. 2 are arranged into a 2×2 matrix. Each sub-memory array 40 is connected with one word line 20, one select line 30, and two bit lines 10. The relationships that the sub-memory arrays 40 are connected with the word lines 20, the select lines 30 and the bit lines 10 are very similar. The similarities thereof are described below.

Figure 3:
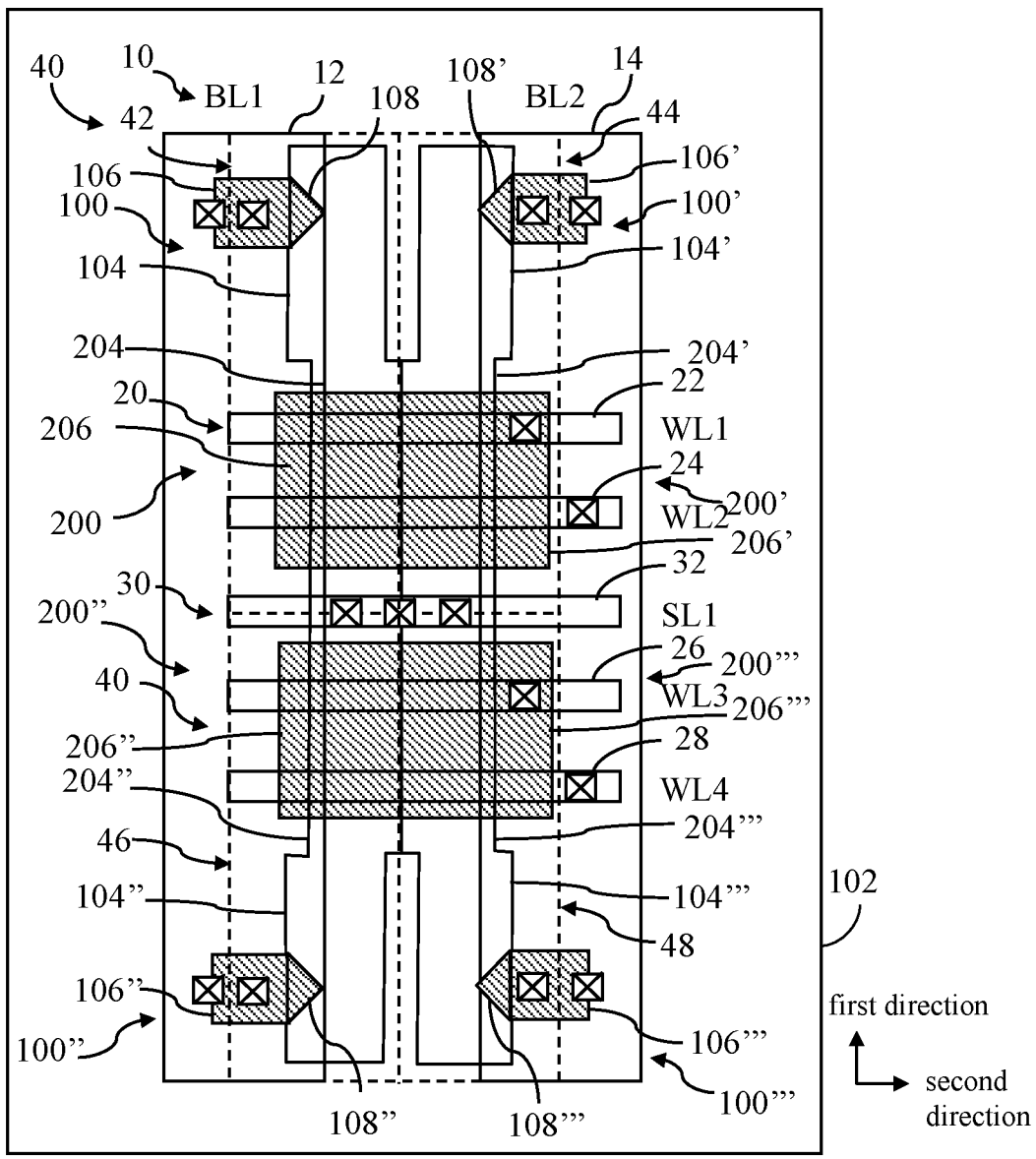
FIG. 3 is a diagram schematically showing a planar layout of the sub-memory arrays according to the first embodiment of the present invention.

Refer to FIG. 3, which is a diagram schematically showing a planar layout of the sub-memory arrays according to the first embodiment of the present invention. In FIG. 3, the upper sub-memory array 40 includes a first antifuse memory cell 42 and a second antifuse memory cell 44, which are disposed between the first bit line 12 and the second bit line 14. The first antifuse memory cell 42 is connected with the first word line 22, the first select line 32 and the first bit line 12. The second antifuse memory cell 44 is connected with the first word line 22, the first select line 32 and the second bit line 14. The first antifuse memory cell 42 and the second antifuse memory cell 44 are adjacent to each other in the horizontal direction (i.e. the second direction). In other words, the first antifuse memory cell 42 and the second antifuse memory cell 44 are in the same row. The lower sub-memory array 40 includes a third antifuse memory cell 46 and a fourth antifuse memory cell 48, which are disposed between the first bit line 12 and the second bit line 14. The third antifuse memory cell 46 is connected with the third word line 26, the first select line 32 and the first bit line 12. The third antifuse memory cell 46 and the first antifuse memory cell 42 are adjacent to each other in the vertical direction (i.e., the first direction). In other words, the third antifuse memory cell 46 and the first antifuse memory cell 42 are in the same column. The fourth antifuse memory cell 48 is connected with the third word line 26, the first select line 32, and the second bit line 14. The fourth antifuse memory cell 48 is located at a position where the horizontal direction of the third antifuse memory cell 46 intersects the vertical direction of the second antifuse memory cell 44. In other words, the fourth antifuse memory cell 48 and the third antifuse memory cell 46 are in the same row; the fourth antifuse memory cell 48 and the second antifuse memory cell 44 are in the same column.

The first and second antifuse memory cells 42 and 44 and the third and fourth antifuse memory cells 46 and 48 are disposed symmetrically along the first select line 32 and all connected with the first select line 32. Therefore, the first and second antifuse memory cells 42 and 44 and the third and fourth antifuse memory cells 46 and 48 may share the source connection contact, and all of them are connected with each other. In comparison with the conventional technology that the antifuse memory cells are respectively connected with different select lines, the present invention has the outperformance of stabilized source structure and reduced layout area.

The first antifuse memory cell 42 includes a first antifuse transistor 100 and a first selection transistor 200 connected with the outside of the first antifuse transistor 100. The first antifuse transistor 100 has a first gate dielectric layer 104 formed above a substrate 102. An antifuse gate 106 has a sharp corner overlapping the first gate dielectric layer 104. The antifuse gate 106 is connected with the first bit line 12. A first ion-doped zone (not shown in the drawings) is connected with the first select line 32. A selection gate 206 of the first selection transistor 200 is connected with the first word line 22. A second gate dielectric layer 204 is formed above the substrate 102. A second ion-doped zone (not shown in the drawings) is connected with the first select line 32.

The second antifuse memory cell 44 includes a second antifuse transistor 100' and a second selection transistor 200' connected with the outside of the second antifuse transistor 100'. The second antifuse transistor 100' has a first gate dielectric layer 104' formed above the substrate 102. An antifuse gate 106' has a sharp corner 108' overlapping the first gate dielectric layer 104'. The first gate dielectric layer 104' and other first gate dielectric layers share one antifuse gate 106', as shown in FIG. 2. The antifuse gate 106' is connected with the second bit line 14. A first ion-doped zone (not shown in the drawing) is connected with the first select line 32. A selection gate 206' of the second selection transistor 200' is connected with the first word line 22. A second gate dielectric layer 204' is formed above the substrate 102. The second ion-doped zone (not shown in the drawing) is connected with the first select line 32. The second gate dielectric layer 204 of the first selection transistor 200 and the second gate dielectric layer 204' of the second selection transistor 200' are connected with each other.

The third antifuse memory cell 46 includes a third antifuse transistor 100" and a third selection transistor 200" connected with the outside of the second antifuse transistor 100". The third antifuse transistor 100" has a first gate dielectric layer 104" formed above the substrate 102. An antifuse gate 106" has a sharp corner 108" overlapping the first gate dielectric layer 104". The antifuse gate 106" is connected with the first bit line 12. A first ion-doped zone (not shown in the drawing) is connected with the first select line 32. A selection gate 206" of the third selection transistor 200" is connected with the third word line 26. A second gate dielectric layer 204" is formed above the substrate 102. The second ion-doped zone (not shown in the drawing) is connected with the first select line 32.

The fourth antifuse memory cell 48 includes a fourth antifuse transistor 100'" and a fourth selection transistor 200'" connected with the outside of the fourth antifuse transistor 100'". The fourth antifuse transistor 100'" has a first gate dielectric layer 104'" formed above the substrate 102. An antifuse gate 106'" has a sharp corner 108'" overlapping the first gate dielectric layer 104'". The first gate dielectric layer 104'" and other first gate dielectric layers share one antifuse gate 106'", as shown in FIG. 2. The antifuse gate 106'" is connected with the second bit line 14. The first ion-doped zone (not shown in the drawing) is connected with the first select line 32. A selection gate 206'" of the fourth selection transistor 200'" is connected with the third word line 26. A second ion-doped zone (not shown in the drawing) is connected with the first select line 32. The second gate dielectric layer 204" of the third selection transistor 200" and the second gate dielectric layer 204'" of the fourth selection transistor 200'" are connected with each other.

Figure 4:
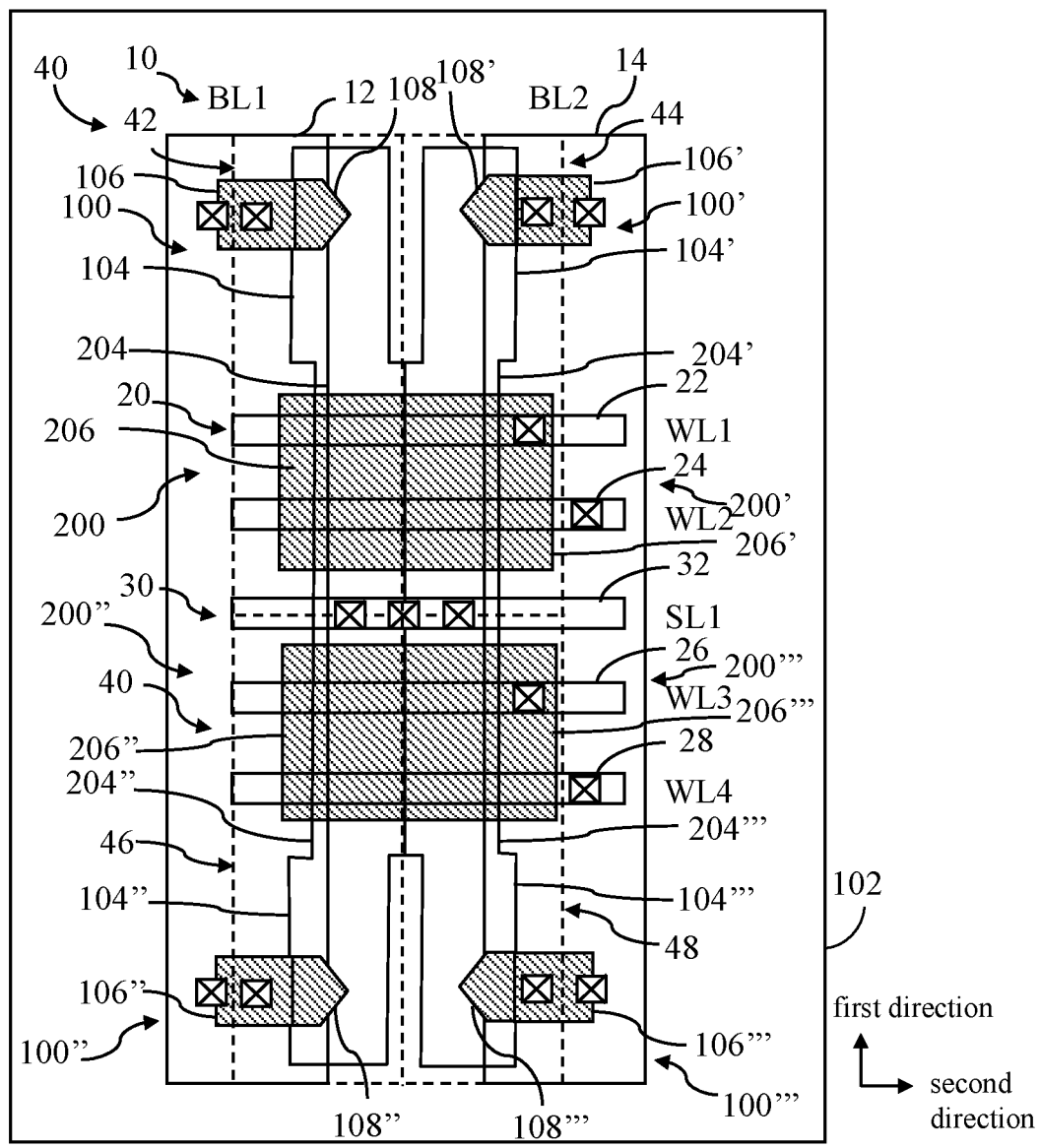
FIG. 4 is a diagram schematically showing a planar layout of the sub-memory arrays according to a second embodiment of the present invention.

In the first embodiment, each of the antifuse gates 106, 106', 106" and 106'", which are separately of the first, second, third, and fourth antifuse memory cells 42, 44, 46, and 48, has the sharp corner 108 overlapping the corresponding first gate dielectric layers 104, 104', 104" or 104'". Two sharp corners 108' and 108", which are separately at the left side of the antifuse gate 106' and the right side of the antifuse gate 106", respectively overlap different first gate dielectric layers. In other words, two neighboring antifuse memory cells, which are separately at the left side and the right side, share one antifuse gate (In the definition of the present invention, the antifuse memory cell 44 and the memory cell 48 respectively belong to different sub-memory arrays). In detail, the overlap region of the first gate dielectric layer 104 and the antifuse gate 106 has a triangular shape, and a sharp corner 108 is formed therein. The angle of the sharp corner 108 is preferably smaller than or equal to 90 degrees. In practice, there may be at least one sharp corner, preferably one sharp corner. However, several sharp corners are acceptable. The present invention does not particularly limit the size of the sharp corner. The size of the sharp corner may be selected according to the writing voltage and the thickness of the first gate dielectric layer. Refer to FIG. 4, which is a diagram schematically showing a planar layout of the sub-memory arrays according to a second embodiment of the present invention. As shown in FIG. 4, the second embodiment discloses another type of antifuse gates 106, 106', 106" and 106'". Each of the antifuse gates 106, 106', 106" and 106'" has more than one sharp corner 108, 108', 108" or 108'", which overlaps the first gate dielectric layer 104, 104', 104" or 104'". Further, the sharp corner 108, 108', 108" or 108'" is extended inside the first gate dielectric layer 104, 104', 104" or 104'" for a distance. In the second embodiment, the overlap region of the first gate dielectric layer 104, 104', 104" or 104'" and the antifuse gates 106, 106', 106" or 106'" is in the form of a pentagonal shape. The pentagonal shape includes two parallel opposite sides; two oblique sides are extended from the two parallel sides and intersect with each other to form a sharp corner 108, 108', 108" or 108'". The present invention utilizes a layout design of the antifuse gates to decrease the area of the antifuse gates and reduce the size of the element, whereby the current consumption is lowered.

Figure 5:
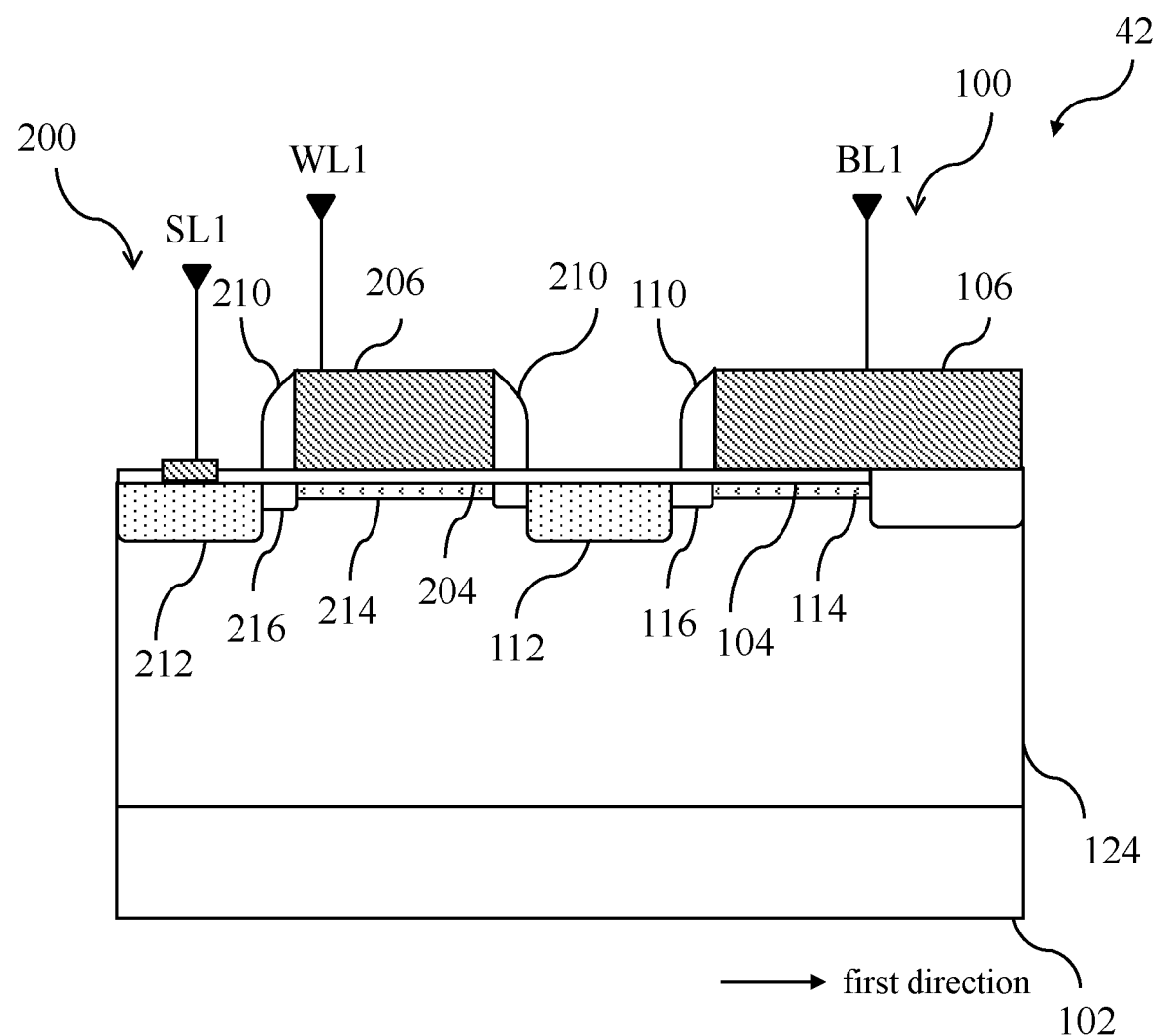
FIG. 5 is a sectional view, which is taken along the first direction and schematically shows the structure of the antifuse memory cell according to the first embodiment of the present invention.

Next are described the detailed structures of the antifuse memory cells 42, 44, 46, and 48. The sectional structures of the antifuse memory cells 42, 44, 46, and 48 are similar. Therefore, the first antifuse memory cell 42 is used for demonstration. As shown in FIG. 5, the first antifuse transistor 100 and the first selection transistor 200 connected in series are formed on a well 124 above the substrate 102. The first antifuse transistor 100 includes a first gate dielectric layer 104, an antifuse gate 106, a lateral separator 110, a first ion-doped zone 112 and a first channel 114. The first gate dielectric layer 104 is formed on the well 124. The antifuse gate 106 is formed on one corner of the first gate dielectric layer 104. The first channel 114 is formed under the antifuse gate 106. The lateral separator 110 is formed on the exterior of the antifuse gate 106. The first ion-doped zone 112 is formed in a region of the well 124, which is at one side of the first gate dielectric layer 104. The first ion-doped zone 112 may have a lightly-doped zone 116 neighboring the vertical edge of the first gate dielectric layer 104. The first selection transistor 200 includes a second gate dielectric layer 204, a selection gate 206, a lateral separator 210, a second ion-doped zone 212, and a second channel 214. The second gate dielectric layer 204 is formed on the well 124. The second gate dielectric layer 204 is connected with the first gate dielectric layer 104. The selection gate 206 covers the second gate dielectric layer 204. The second channel 214 is formed under the selection gate 206. The lateral separators 210 are formed on two lateral sides of the selection gate 206. The first ion-doped zone 112 is formed in one side of the second gate dielectric layer 204; the second ion-doped zone 212 is formed in another side of the second gate dielectric layer 204. In other words, the second ion-doped zone 212 is formed inside a region of the well 124, which is far away from the first ion-doped zone 112. The second ion-doped zone 212 may have a lightly-doped zone 216 neighboring the vertical edge of the second gate dielectric layer 204. The first ion-doped zone 112 and the second ion-doped zone 212 may be doped with the same type of ions. The first ion-doped zone 112 and the well 124 are respectively doped with different types of ions, and the concentrations of the ions may be different according to the operation voltage.

In the embodiment, the substrate 102 may be a P-type semiconductor substrate or an N-type semiconductor substrate. While the substrate 102 is a P-type semiconductor substrate, the first ion-doped zone 112 and the second ion-doped zone 212 are N-type doped zones, and the well 124 is a P-type doped zone. While the substrate 102 is an N-type semiconductor substrate, the first ion-doped zone 112 and the second ion-doped zone 212 are P-type doped zones, and the well 124 is an N-type doped zone. The first gate dielectric layer 104 is a gate oxide formed under the antifuse gate 106, relatively thinner and having an about uniform thickness. The first gate dielectric layer 104 may be made of a material selected from a group including oxides, nitrides, oxynitrides, metal oxides, and combinations thereof. The antifuse memory cells mentioned in the above-mentioned embodiments may be fabricated in any standard CMOS process, such as the lateral separator formation process, the light-doping process, and the gate silicification process. The second gate dielectric layer 204 and the first gate dielectric layer 104 are fabricated simultaneously. The second gate dielectric layer 204 and the first gate dielectric layer 104 substantially have an identical composition. The second gate dielectric layer 204 and the first gate dielectric layer 104 may have an identical thickness or respectively have different thicknesses.

Figure 6:
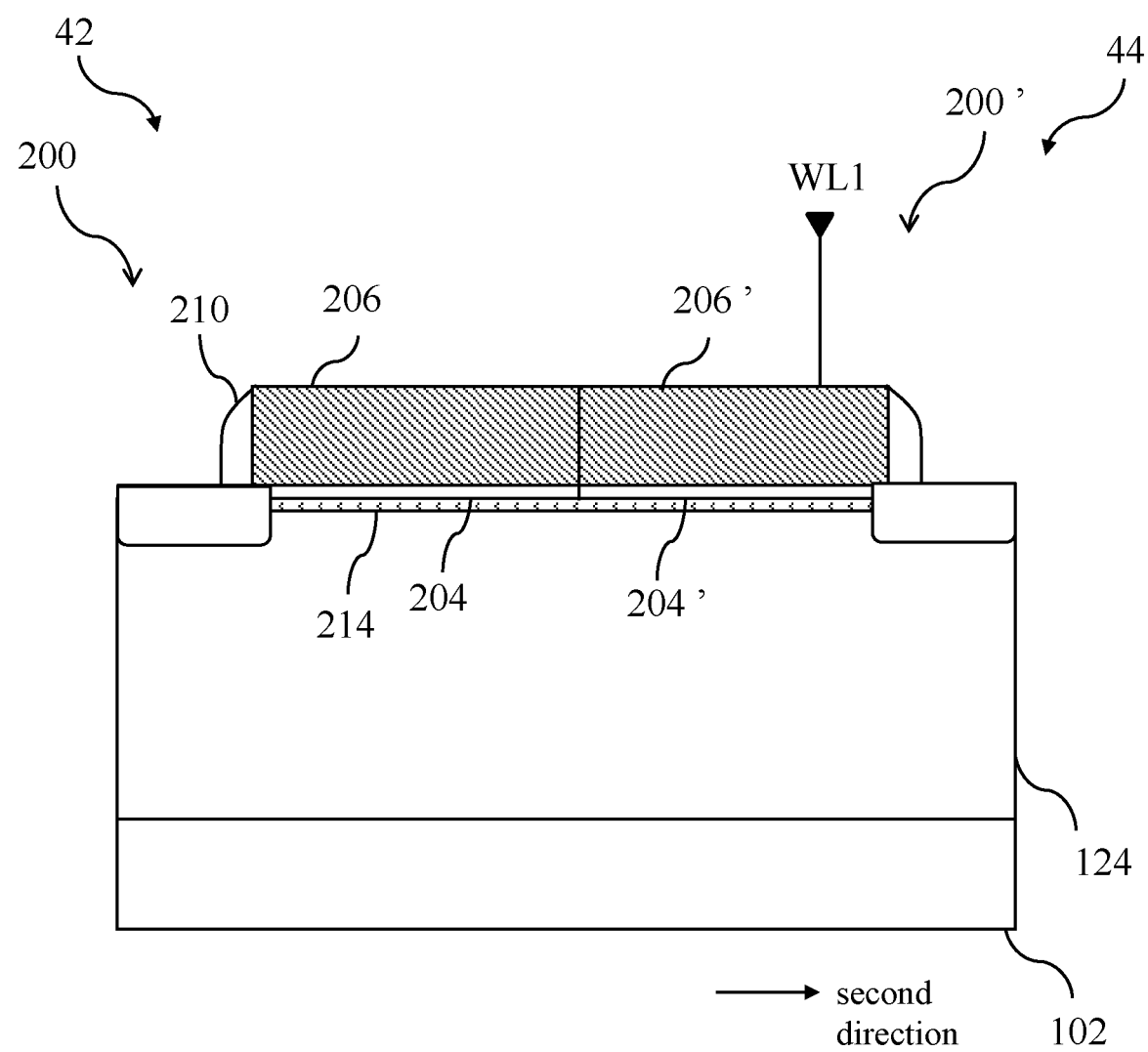
FIG. 6 is a sectional view, which is taken along the second direction and schematically shows the structure of two selection transistors of the antifuse memory cell according to the first embodiment of the present invention.

Refer to FIG. 6. The first antifuse memory cell 42 and the second antifuse memory cell 44 share a second channel 214. The second gate dielectric layer 204 of the first selection transistor 200 and the second gate dielectric layer 204' of the second selection transistor 200' are connected with each other, whereby the first selection transistor 200 and the second selection transistor 200' can share the second channel 214. The width of the second channel 214 is larger than the width of the first channel 114. The present invention arranges two selection transistors to share a channel to increase the channel width of the selection transistors and raise the writing rate without increasing the overall area of the layout.

While a writing operation is performed, the first select line 32 is grounded, and a low voltage is applied to the first bit line 12 or the second bit line 14 for selecting the right column of antifuse memory cells 44 and 48 of the sub-memory array 40 or the left column of the antifuse memory cells 42 and 46 of the sub-memory array 40, and a low voltage is applied to the first word line 22 or the third word line 26 for selecting a specified antifuse memory cell in a specified column of the sub-memory array 40, and then the first gate dielectric layer 104 is broken down. For example, the first select line 32 is grounded, and a low voltage is applied to the first bit line 12, and a low voltage is applied to the first word line 22, whereby to select the first antifuse memory cell 42 for a writing operation.

The present invention uses a word line to replace a select line in selecting an antifuse memory cell for a writing operation, whereby to exempt the other antifuse memory cells from being influenced by the selection bias and also prevent from occurrence of leakage current. In the present invention, the antifuse gate has at least one corner overlapping the first gate dielectric layer. Based on the principle of point discharge, the corner has a great amount of charges concentrating thereon and thus has stronger electric field. Hence, a lower writing voltage is sufficient to break down the portion of first gate dielectric layer, which is corresponding to the corner. Consequently, the first gate dielectric layer can be broken down more easily, and the writing time is shortened.

In conclusion, the present invention proposes a high writing rate antifuse array, which is based on a structure of sharing a common antifuse gate, wherein each antifuse transistor has at least one sharp corner overlapping the antifuse gate formed above the first gate dielectric layer, and wherein the second gate dielectric layers of the selection transistors of two antifuse memory cells are connected with each other, whereby two antifuse memory cells can be connected with the same select line and the same word line and can be respectively connected with different bit lines. Further, the present invention is characterized in that two selection transistors share a common channel, whereby the channel width of the selection transistor is increased, and the breakdown current is maximized, wherefore the success rate and robustness of breakdown are raised, and the writing rate is upgraded. Furthermore, the present invention is characterized in that a common source contact is used, whereby a stabilized source structure is achieved and the overall area of the layout is reduced. Moreover, the present invention is able to use a minimal control voltage to provide a maximal current, decrease the probability of leakage current and lower the fabrication cost.

The embodiments have been described above to demonstrate the principles of the present invention and enable the persons skilled in the art to understand, make, and use the present invention. However, these embodiments are only to exemplify the present invention but not to limit the scope of the present invention. Any equivalent modification or variation according to the principle, spirit, or embodiment of the present invention is to be also included by the scope of the present invention.

What is claimed is:

1. An antifuse array, comprising
    a plurality of parallel bit lines, extending along a first direction and including a first bit line and a second bit line, which neighbor each other;
    a plurality of parallel word lines, extending along a second direction, vertical to the plurality of bit lines, and including a first word line, wherein the second direction is different from the first direction;
    a plurality of parallel select lines, extending along the second direction, parallel to the word lines, and including a first select line; and
    at least one sub-memory array, including a first antifuse memory cell and a second antifuse memory cell, wherein the first antifuse memory cell includes a first antifuse transistor connected with the first bit line, and a first selection transistor cascaded to the first antifuse transistor and connected with the first word line and the first select line, and wherein the second antifuse memory cell includes a second antifuse transistor connected with the second bit line, and a second selection transistor cascaded to the second antifuse transistor and connected with the first word line and the first select line, and wherein the first antifuse memory cell and the second antifuse memory cell neighbor each other in the second direction and are disposed between the first bit line and the second bit line, and
    wherein each of the first antifuse transistor and the second antifuse transistor includes a first gate dielectric layer and an antifuse gate; the antifuse gate has at least one sharp corner overlapping the first gate dielectric layer; each of the first selection transistor and the second selection transistor includes a second gate dielectric layer; the second gate dielectric layers are directly connected with each other;
    wherein a first channel is formed under the antifuse gate; the first selection transistor and the second selection transistor share a second channel; a width of the second channel is larger than a width of the first channel;
    the first antifuse memory cell and the second antifuse memory cell are disposed between the first bit line and the second bit line;
    the first gate dielectric layer and the second gate dielectric layer are connected to each other.

2. The antifuse array according to claim 1, wherein a region where the first gate dielectric layer overlaps the antifuse gate has a triangular shape.

3. The high writing rate antifuse array according to claim 1, wherein a region where the first gate dielectric layer overlaps the antifuse gate has a pentagonal shape; the pentagonal shape includes two parallel opposite sides; two oblique sides are extended from the two parallel opposite sides and intersect with each other.

4. The antifuse array according to claim 1, wherein the first antifuse transistor includes
    the antifuse gate, formed above a substrate and connected with the first bit line;
    the first gate dielectric layer, formed between the antifuse gate and the substrate; and
    a first ion-doped zone, formed in a region above the substrate, which is at one side of the first gate dielectric layer;

the first selection transistor includes
- a selection gate, formed above the substrate and connected with the first word line;
- the second gate dielectric layer, formed between the selection gate and the substrate; and
- a second ion-doped zone, formed in a region above the substrate, which is at one side of the second gate dielectric layer and far away from the first ion-doped zone, and connected with the first select line, wherein the first ion-doped zone and the second ion-doped zone are doped with an identical type of ions.

5. The antifuse array according to claim 4, wherein the substrate is a P-type semiconductor substrate; the second ion-doped zone and the first ion-doped zone are N-type doped zones.

6. The antifuse array according to claim 4, wherein the substrate is an N-type semiconductor substrate; the second ion-doped zone and the first ion-doped zone are P-type doped zones.

7. The antifuse array according to claim 1, wherein the second
antifuse transistor includes
- the antifuse gate, formed above a substrate and connected with the second bit line;
- the first gate dielectric layer, formed between the antifuse gate and the substrate; and
- a first ion-doped zone, formed in a region above the substrate, which is at one side of the first gate dielectric layer;

the second selection transistor includes
- a selection gate, formed above the substrate and connected with the first word line;
- the second gate dielectric layer, formed between the selection gate and the substrate; and
- a second ion-doped zone, formed in a region above the substrate, which is at one side of the second gate dielectric layer and far away from the first ion-doped zone, and connected with the first select line, wherein the first ion-doped zone and the second ion-doped zone are doped with an identical type of ions.

8. The antifuse array according to claim 7, wherein the substrate is a P-type semiconductor substrate; the second ion-doped zone and the first ion-doped zone are N-type doped zones.

9. The antifuse array according to claim 7, wherein the substrate is an N-type semiconductor substrate; the second ion-doped zone and the first ion-doped zone are P-type doped zones.

* * * * *